United States Patent
Li et al.

(10) Patent No.: US 6,215,645 B1
(45) Date of Patent: Apr. 10, 2001

(54) DIFFERENTIAL CAPACITOR STRUCTURE

(75) Inventors: Guang Xuan Li, Gilbert; Frank A. Shemansky, Jr., Phoenix; Ronald James Gutteridge, Paradise Valley; Daniel N. Koury, Jr., Mesa; Zuoying Lisa Zhang, Gilbert, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/071,623

(22) Filed: May 1, 1998

(51) Int. Cl.$^7$ .................................................. H01G 7/00

(52) U.S. Cl. ........................... 361/283.3; 73/514.32

(58) Field of Search .............................. 361/283.3, 321.3, 361/320, 283.4, 763, 773; 73/514.32; 29/25.42; 174/260

(56) References Cited

U.S. PATENT DOCUMENTS 5,146,389 * 9/1992 Ristic et al. ..................... 361/283.3

* cited by examiner

*Primary Examiner*—Kristine Kincaid
*Assistant Examiner*—Anthony Dinkins
(74) *Attorney, Agent, or Firm*—Robert Atkins; Lanny L. Parker

(57) ABSTRACT

A differential capacitor structure (10) formed overlying a substrate (12) having a middle layer (24) disposed between a lower layer (18) and an upper layer (28). The lower layer (18) is a static layer that is formed on the substrate (12), the middle layer (24) has a moveable component and is a dynamic layer attached to the substrate (12) using semi-circular tether supports (42), and the upper layer is a static layer that is anchored to the substrate (12). The semi-circular tether supports (42) are formed from a homogeneous material and provide structural stiffness to support the middle layer (24) in space and also provide stress relief.

14 Claims, 1 Drawing Sheet

DIFFERENTIAL CAPACITOR STRUCTURE

BACKGROUND OF THE INVENTION

The present invention relates, in general, to systems containing a sensing component and, more particularly, to sensing structures comprising a moveable component such as found in a transducer.

Capacitive transducers are one type of micromachined sensors using a moveable component to detect acceleration. Capacitive transducers are used in automotive applications as accelerometers in crash sensing for air-bag deployment. Other applications include ride control, inertial navigation, and virtual reality systems. The moveable component in the sensor forms one plate of a capacitor and a variation in spacing between the moveable component and a substantially stationary conductive plate produces a corresponding variation in capacitance value. A sensing circuit coupled to the capacitor detects the change in capacitance value and provides a measurement of the force that caused movement of the moveable component.

The capacitor structure comprises three polysilicon layers that form two capacitors. The first capacitor is formed by a bottom polysilicon layer that adheres to the substrate and a middle polysilicon layer that is suspended by support beams. The second capacitor is formed by the middle polysilicon layer and a top polysilicon layer that is also anchored at various points to the substrate. Mechanically, the bottom and the top polysilicon layers have little motion relative to the substrate and are considered as rigid bodies. The middle layer is deflected either toward the top polysilicon layer or toward the bottom polysilicon layer when subjected to a force with a component in the compliant direction, resulting in changes in capacitance for both capacitors.

Support beams provide support for the middle polysilicon layer and can be made of a thin layer of silicon nitride sandwiched between two polysilicon layers. Although the doped polysilicon can have a compressive force, the combination of the silicon nitride and polysilicon layers provides a tensile force capable of suspending the middle polysilicon layer about equal distances between the top and bottom polysilicon layers. However, the difference in temperature coefficients between the silicon nitride and the doped polysilicon in the support beams causes the tension in the beams to vary as the temperature varies, resulting in a change of the overall structural stiffness and sensitivity of the sensor.

Accordingly, there is a need for a capacitor sensor having a moveable component to detect acceleration where the support beams are elastic and provide stable mechanical support. It would be a further advantage to have a sensor that is easily and inexpensively manufactured, minimizes the effects of temperature variations on the sensitivity of the sensor, and is insensitive to residual film stress and externally imposed stress.

DETAILED DESCRIPTION OF THE DRAWINGS

A differential capacitor structure is used as a sensor for measuring acceleration. The differential capacitor has a moveable dynamic conductive layer suspended between first and second static conductive layers. The lower static layer is disposed on a substrate, the dynamic middle layer has, in this example, a square or rectangular shape and is attached to the substrate by tether supports or beams having a circular arc shape, and the upper static layer is anchored to the substrate. The dynamic layer is electrically isolated from the first and second static layers. The circular arc beams are formed from a homogeneous material and provide structural stiffness to support the dynamic layer in space and also provide release from stress caused by temperature variations or process conditions. Differential capacitance is detected by measuring the capacitance between the dynamic layer and the lower static layer for comparison with the measured capacitance between the dynamic layer and the upper static layer.

Figure 1:
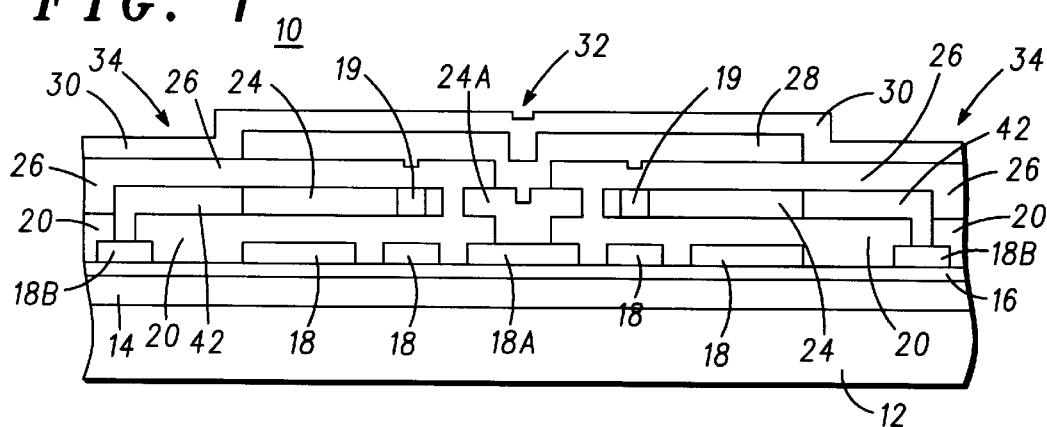
FIG. 1 is a cross-sectional view of a portion of a differential capacitor structure during processing.

FIG. 1 is a cross-sectional view of a portion of a differential capacitor structure 10 during processing.

Capacitor structure 10 includes a substrate 12 comprised of monocrystalline silicon and having an N-type conductivity. Although an N-type silicon substrate is depicted herein, it should be understood that other semiconductor, conductive or non-conductive substrates may be used. An insulating layer 14 comprising silicon dioxide is formed on the surface of substrate 12 to a thickness of about 2 microns. Insulating layer 14 is formed conformally and then patterned and etched. It should be further understood that if substrate 12 is non-conductive, insulating layer 14 is not necessary.

A nitride layer 16 is deposited over insulating layer 14 of silicon nitride to a thickness of about 0.2 microns. A lower layer 18 is formed as a blanket layer over nitride layer 16, for example, of polysilicon. Lower layer 18 as the lower static layer of differential capacitor structure is then patterned.

A sacrificial layer 20 of, for example, phosphosilicate glass (PSG), is deposited over the patterned lower layer 18 to a thickness of about 2.0 microns. The thickness of sacrificial layer 20 may be varied depending upon the distance that is desired between lower layer 18 and the layer above, i.e., a middle layer 24. It should be understood that other sacrificial materials may be employed in place of phosphosilicate glass. Vias or openings (not shown) are formed in sacrificial layer 20 that correspond to a location 32 where an anchor is to be formed and to a location 34 where a tether support is to be formed. The anchor at location 32 provides structural support for the upper static layer of differential capacitor structure 10. The tether at location 34 provides structural support for the dynamic layer of differential capacitor structure 10.

After vias (not shown) are formed in sacrificial layer 20, a blanket layer of polysilicon is formed overlying sacrificial layer 20 and then patterned to form middle layer 24. Middle layer 24 is the dynamic layer of differential capacitor structure 10. Following patterning of middle layer 24, a portion 24A of middle layer 24 is connected to a portion 18A of lower layer 18 at anchor location 32. Another portion of middle layer 24 is connected to a portion 18B of lower layer 18 at tether location 34. It should be noted that portion 18A of lower layer 18 which is part of the anchor at location 32 is not electrically coupled to the other portions of lower layer 18. It should be further understood that portion 24A of middle layer 24 which is at location 32 is not electrically coupled to the other portions of middle layer 24.

After middle layer 24 is patterned, a sacrificial layer 26 comprising, for example, phosphosilicate glass is formed on patterned middle layer 24. Vias (not shown) are formed in sacrificial layer 26 and a blanket layer of polysilicon is formed overlying sacrificial layer 26 and then patterned to form an upper layer 28. Upper layer 28 is the upper static layer of capacitor structure 10 and is connected to middle layer 24A at anchor location 32. Thus, lower layer 18A, middle layer 24A, and upper layer 28 are commonly connected at anchor location 32. It is important that the dynamic portions of middle layer 24 and lower layer 18 not be electrically coupled at anchor location 32.

A third sacrificial layer 30 is formed on patterned upper layer 28. Third sacrificial layer 30 comprises, for example, phosphosilicate glass and is formed conformally and patterned. Third sacrificial layer 30 protects upper layer 28 during the deposition of a metal layer (not shown).

Figure 2:
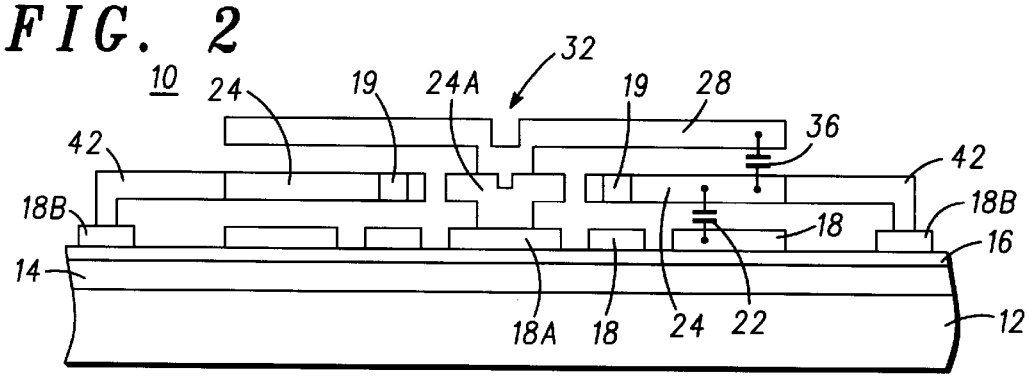
FIG. 2 is a cross-sectional view of a portion of the differential capacitor structure further along in processing.

FIG. 2 is a cross-sectional view of a portion of differential capacitor structure 10 further along in processing. It should be noted that the same reference numbers are used in the figures to denote the same elements. Differential capacitor structure 10 includes static lower layer 18 disposed on substrate 12. Middle layer 24 is disposed above lower layer 18 and has a configuration wherein portions of middle layer 24, i.e., middle layer 24A, are attached to lower layer 18A and the dynamic portion of middle layer 24 is attached to lower layer 18B via arms at location 34. Lower layer 18B is not electrically coupled to the portion of lower layer 18 which serves as a capacitive plate. Upper layer 28 is formed over middle layer 24 and lower layer 18.

Following the formation of capacitor structure 10 as shown in FIG. 1, sacrificial layers 20 and 26 are removed. A selective etchant such as a hydrofluoric (HF) acid solution removes the phosphosilicate glass sacrificial layers 20 and 26 without appreciably damaging the polysilicon of lower layers 18, 18A, and 18B, middle layers 24 and 24A, and upper layer 28. It should be understood that other materials may be used for the conductive, sacrificial and protective layers as long as a selective etchant is available to selectively remove sacrificial layers 20 and 26.

The removal of sacrificial layers 20 and 26 may be performed significantly faster if middle layer 24 and upper layer 28 are patterned to include a plurality of perforations or apertures 19. Apertures 19 more readily expose sacrificial layers 20 and 26 to the selective etchant.

The anchor at location 32 comprises physically coupled portions of lower layer 18, middle layer 24, and upper layer 28. The anchor at location 32 serves to support upper layer 28 following the removal of sacrificial layers 20 and 26. It is important that the anchor at location 32 only be electrically coupled to one conductive layer in differential capacitor structure 10. It should be understood that references to layers of the capacitor structure refer to electrical conductors and not to the physical layers as deposited in the manufacturing process. As shown, the anchor at location 32 is electrically coupled only to upper layer 28 in the capacitive portion of capacitor structure 10.

Differential capacitor structure 10 includes a first capacitor 22 and a second capacitor 36. First capacitor 22 is governed by the capacitance between lower layer 18 and middle layer 24 while capacitor 36 is governed by the capacitance between middle layer 24 and upper layer 28. Capacitor structure 10 is configured so that lower layer 18 is static by virtue of being disposed on substrate 12 and upper layer 28 is also static by virtue of being rigidly supported by a plurality of anchors, one of which is illustrated at location 32. Middle layer 24 is a dynamic layer and configured to flex between lower layer 18 and upper layer 28 by being supported at location 34. By way of example, when middle layer 24 is deflected towards lower layer 18, capacitor 22 has an increase in capacitance and capacitor 36 has a decrease in capacitance.

Figure 3:
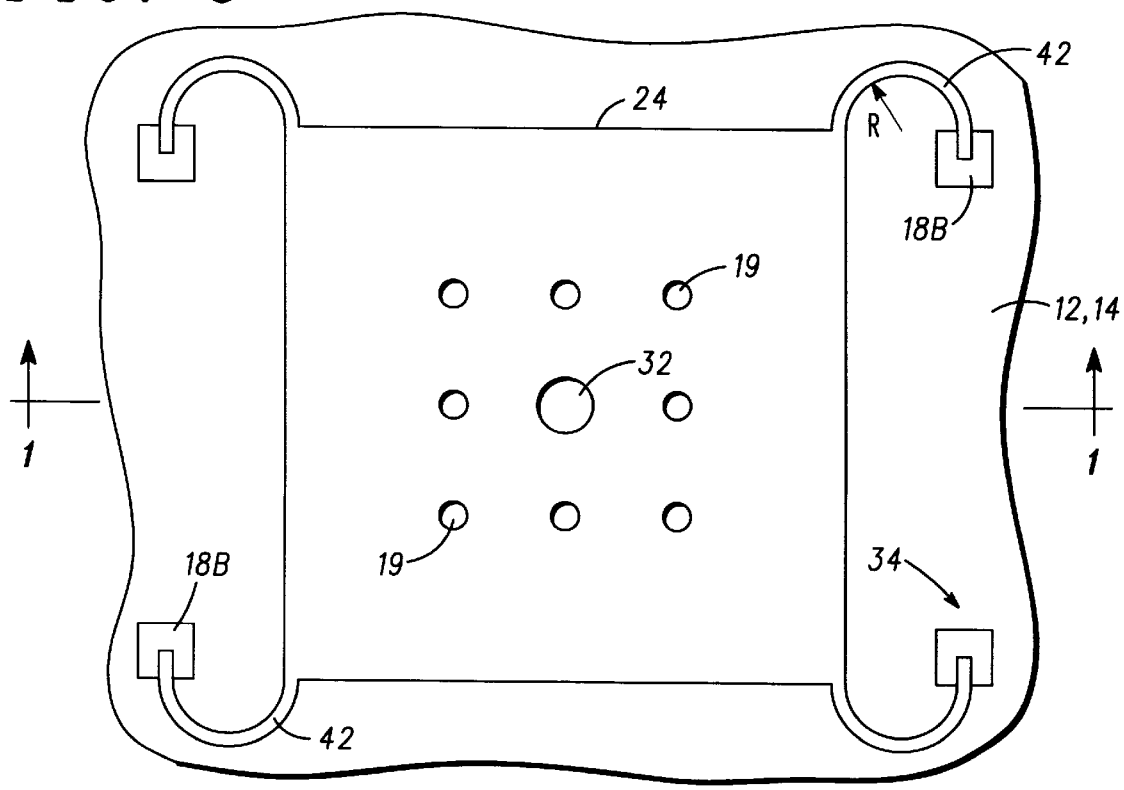
FIG. 3 is a top view of a middle conductive layer of the differential capacitor structure of FIG. 1.

FIG. 3 is a top view of middle layer 24 of differential capacitor structure 10. Middle layer 24 is supported and allowed to flex by a plurality of tether supports 42. Tether supports 42 are formed of polysilicon in the process step that forms middle layer 24. Each tether support 42 is a geometrically nonlinear support structure formed of a substantially homogeneous material that extends from a corner of the rectangular shaped middle layer 24 to a support in location 34 on substrate 12. Tether supports 42 comprise some portion of a circular or other geometrically nonlinear shaped arc, and in this embodiment have a semi-circular shape. It should be noted that the graphic shapes used in a computer system to define tether supports 42 may be comprised of short segments of linear lines that when taken together approximate the desired non-linear path. Semiconductor design software often constructs circular arcs from a series of small linear segments. Thus, mechanical support structures such as tether supports 42 may be constructed of multiple linear segments where the angle between adjoining segments is less than 45 degrees.

Alternatively, other examples of shapes for tether supports 42 include a U shape, a circular arc, a spiral, open-ended circular shapes, or combinations of multiple arcs or bends that provide stress relief. In other words, tether supports 42 are formed from a homogenous material in a U shaped path, circular arc path, or other non-linear path from the dynamic conductive layer to the substrate, i.e., from middle layer 24 to lower layer 18B on substrate 12. Four tether supports 42 are shown for supporting middle layer 24, but it should be understood that the number of tether supports 42 may be varied, as may the shape of middle layer 24.

Tether supports 42 allow deflection of middle layer 24 when capacitor structure 10 is subjected to an acceleration which has a component in a direction that is perpendicular to the rectangular middle layer 24. Thus, capacitor structure 10 is a transducer that is housed in a semiconductor package and includes first and second structures, i.e., lower layer 18 and upper layer 28, which are substantially stationary with respect to the semiconductor package. A moveable component, i.e., middle layer 24, is disposed between the first and second structures and supported by a plurality of geometrically nonlinear support structures, i.e., tether supports 42.

The sensitivity of differential capacitor structure 10 in general, and the structural stiffness of the sensor in particular, is controlled or limited over the temperature range by tether supports 42. By way of example, an automotive air bag accelerometer application subjects differential capacitor structure 10 to temperatures that range from −40 degrees Centigrade (°C.) to 105° C. Middle layer 24 supported by curved tether supports has a spring constant that changes less than about 0.5 percent over the temperature range of −40 degrees °C. to 105° C. With tether supports 42 formed of a homogeneous material in a semi-circular shape having a radius R, the spring constant is predominantly controlled by tether supports 42, i.e., a monolithic polysilicon layer.

Another parameter that affects the value for the spring constant of capacitor structure 10 is the stress that exists in thin films even without external loadings. Stress occurs in the deposition process in forming tether supports 42, in the differential thermal mismatches between tether supports 42 and substrate 12, and in differences of thermal expansion coefficients of packaging materials. The undesired stresses affect the mechanical characteristics of capacitor structure 10. Middle layer 24 supported by curved tether supports 42 provides a dynamic middle layer 24 that reduces stress sensitivity in capacitor structure 10.

By now, it should be appreciated that there has been provided a planar polysilicon structure having a moveable component for sensing acceleration. The rectangular or square shaped middle layer is supported by tethers formed of a homogenous polysilicon material. The circular arc shaped tethers allow the middle layer to flex while controlling and limiting the spring constant variations over a temperature range. This results in a smaller, less costly sensing structure. The planar homogeneous dynamic structure improves the manufacturability of the capacitive structure.

We claim:

1. A differential capacitor structure comprising:

a substrate;

a first static layer disposed on the substrate;

a second static layer disposed above and electrically isolated from the first static layer;

a dynamic layer suspended between and electrically isolated from the first and second static layers; and tether supports that couple the dynamic layer to the substrate, wherein the tether supports are circular arc shaped.

2. The differential capacitor structure of claim 1, wherein the dynamic layer has a rectangular shape.

3. The differential capacitor structure of claim 1, wherein the tether supports are a homogenous material.

4. A transducer housed in a semiconductor package, comprising:

first and second structures which are stationary with respect to the semiconductor package; and a moveable mass disposed between the first and second structures, wherein the moveable mass is supported by a nonlinear support structure.

5. The transducer of claim 4, wherein the nonlinear support structure has a circular arc shape.

6. The transducer of claim 5, wherein the circular arc shape is a semi-circular shape.

7. The transducer of claim 4, wherein the nonlinear support structure has a U shape.

8. The transducer of claim 4, wherein the nonlinear support structure is formed of a homogeneous material.

9. The transducer of claim 4, wherein the moveable mass has a square shape.

10. A transducer housed in a semiconductor package, comprising:

first and second structures which are stationary with respect to the semiconductor package; and a moveable mass disposed between the first and second structures, wherein the moveable mass is supported by a homogeneous tether.

11. The transducer of claim 10, wherein the homogeneous tether has a circular arc shape.

12. The transducer of claim 10, wherein the homogeneous tether has a U shape.

13. The transducer of claim 10, wherein the homogeneous tether is formed of polysilicon.

14. The transducer of claim 10, wherein the moveable mass has a square shape.

* * * * *